United States Patent [19]
Guess et al.
[11] 4,193,647
[45] Mar. 18, 1980

[54] PIEZOELECTRIC CERAMIC TRANSDUCERS WITH UNIFORM RESONANT FREQUENCY

[75] Inventors: Joe F. Guess, Cedar Rapids, Iowa; William J. Gastmeier, Stratford, Canada

[73] Assignee: Telex Communications, Inc., Minneapolis, Minn.

[21] Appl. No.: 941,024

[22] Filed: Sep. 11, 1978

[51] Int. Cl.[2] .............................................. H01L 41/10
[52] U.S. Cl. ............................... 310/324; 179/110 A; 179/115 R; 179/138; 29/25.35; 310/312; 310/321
[58] Field of Search ............... 310/322, 321, 324, 312, 310/334; 179/110 A, 115 R, 138 R, 181 R; 340/14; 181/173, 174, 157, 158, 161, 185; 29/25.35

[56] References Cited

U.S. PATENT DOCUMENTS

| | | | |
|---|---|---|---|
| 1,450,287 | 4/1923 | Hahnemann | 340/14 X |
| 1,589,962 | 6/1926 | Hecht et al. | 340/14 X |
| 3,777,192 | 12/1973 | Barrow | 310/312 |
| 4,050,541 | 9/1977 | Henricksen | 181/185 X |
| 4,122,365 | 10/1978 | Stephens | 310/324 |
| 4,156,156 | 5/1979 | Sweany et al. | 310/324 X |

*Primary Examiner*—Mark O. Budd
*Attorney, Agent, or Firm*—Charlton M. Lewis

[57] ABSTRACT

The resonant frequency of piezoelectric transducers is made more uniform from unit to unit by reducing the sensitivity of that frequency to manufacturing variations in the diameter of the ceramic sensing disk that forms a part of the vibratory diaphragm assembly. The diaphragm member proper is stiffened, as by integrally formed radial ribs, within the zone of variability of the disk perimeter, effectively establishing a uniform boundary edge for the diaphragm area that is stiffened by presence of the disk.

9 Claims, 5 Drawing Figures

PIEZOELECTRIC CERAMIC TRANSDUCERS WITH UNIFORM RESONANT FREQUENCY

BACKGROUND OF THE INVENTION

This invention concerns piezoelectric ceramic resonant transducers in which a vibratory diaphragm member is edge mounted and carries a flat ceramic disk on at least one of its faces for sensing or driving flexure of the diaphragm.

Flexure of such a diaphragm assembly perpendicular to its plane is associated with radial stretching or compression of the ceramic. Those stresses are accompanied by electrical potentials of opposite polarity at the respective disk surfaces, corresponding to the piezoelectric properties of the material. Electrodes in contact with the opposite faces of the disk convey the electrical signal between the transducer and an external circuit of any desired type.

The invention is concerned more particularly with such transducers in which the diaphragm and its carried ceramic disk are free to flex in fundamental mode at their natural or resonant frequency of vibration. Under that condition the transducer is a highly sensitive detector of vibrations at that same frequency and can drive such vibrations with good efficiency in response to an input periodic electrical signal.

In order to insure optimum sensitivity of selective response at a sharply defined target frequency, whether for detection or generation of vibrations, it is important that the resonant frequency of vibration of the transducer match that target frequency as closely as possible.

The utility of such selectively responsive transducers has been limited in the past by difficulty in producing economical transducers having a well-defined resonant frequency that is satisfactorily uniform from one unit to another. Under conditions of mass production, especially when the production cost must be held to a minimum, individual transducers tend to differ in resonant frequency over a range that is excessive for many applications.

An effective solution for certain aspects of that difficulty is described and claimed in the copending patent application Ser. No. 927,546, which was filed under the title "Piezoelectric Ceramic Resonant Transducers with Stable Frequency" by Joe F. Guess, one of the present joint applicants, and which is assigned to the same assignee as the present application.

BRIEF DESCRIPTION OF THE INVENTION

An important objective of the present invention is to provide structure and methods for improving the uniformity of the resonant frequency in piezoelectric ceramic resonant transducers of the described type without significantly increasing the production cost.

More particularly, the invention aims to reduce variation of resonant frequency from unit to unit due to dimensional variations of the ceramic disk sensors.

We have discovered that much of the variability in frequency among individual transducers is due to small variations in the diameter of the piezoelectric sensor which forms an effectively integral part of the vibrating element. Manufacture of the piezoelectric ceramic sensors includes a firing process, causing shrinkage of the element that is difficult to control accurately at low cost. Hence the diameter of the finished ceramic disk is ordinarily specified with much more generous tolerance than dimensions that depend upon conventional metal fabrication. The inside diameter of the clamping structure, for example, can be considered rigorously precise by comparison with the disk diameter.

Moreover, we have found that variability of only a few percent in the diameter of the sensing disk can produce a larger relative change in resonant frequency of the completed transducer. That appears to be due to the fact that the effective spring constant of a vibrating system tends to depend largely upon the portions of greatest flexibility. In the present structure, the annular zone of bare diaphragm between the perimeter of the sensing disk and the rigid clamp or equivalent structure is far more flexible than the sandwich portion of the diaphragm assembly, which is stiffened by the ceramic sensor. Hence the resonant frequency depends sensitively upon the radial width of that bare zone.

Also, the width of that sensitive annular zone is typically only a small fraction of the disk diameter, and therefore depends critically upon relatively small changes in the disk size. For example, a disk that is oversize by only two percent may reduce the zone width by as much as 20%. The resulting change in the effective spring constant typically alters the resonant frequency more seriously than the accompanying increase of about 4% in the ceramic mass, especially since the extra mass is close to the perimeter where the amplitude is relatively small.

The present invention accepts the described normal variability of the ceramic diameter, but eliminates it as a cause of significant variability of the resonant frequency of the transducer. That is accomplished by introducing structure which redefines the zone of high flexibility in a manner to make it essentially independent of the disk diameter. From an alternative viewpoint, the invention establishes a uniform boundary edge for the central stiffened area of the diaphragm. To provide such a boundary the metal diaphragm is artifically stiffened within an accurately defined zone that includes at least the entire area of variability of the ceramic disk periphery.

That may be done, for example, by cementing or soldering an annular stiffening member to the diaphragm face opposite the sensor. A preferred procedure is to provide the diaphragm with a plurality of angularly spaced ribs which extend radially across the zone to be stiffened. Such ribs are typically formed integrally in the diaphragm. Any desired degree of stiffness enhancement is readily obtainable, as by suitable selection of the number and the cross sectional form of the stiffening ribs.

The most desirable degree of stiffness enhancement depends upon many factors of each situation. It is preferred to increase the stiffness of the bare diaphragm by an amount that exceeds the increase caused by the ceramic disk by a factor of at least about two, and a factor of five or more may add significant stabilization of the resonant requency. In actual practice, it is often convenient to make the structure virtually rigid, at least by comparison with the flat diaphragm material, within the rather narrow zone of variability of the sensor edge. A stiffness increase of ample proportions may be produced, for example, by providing about eight ribs at uniform angular intervals, each rib being of essentially rectangular U-form with a depth of the order of five times the thickness of the diaphragm sheet material.

The ribs are preferably shaped with a gradual taper, at least at their inner ends, such that the stiffening action decreases gradually with decreasing radius, reaching zero at a radius that is well inside the minimum disk radius but leaves a major fraction of the bilayer area unaffected.

The described rib structure provides the further advantage that excess cement, necessary to get a complete bond between the ceramic and the diaphragm member, can flow into the hollow ribs. That action reduces the tendency for such cement to spread onto the diaphragm surface immediately surrounding the sensor, where it might significantly alter the effective elastic constant. Since the ribs are inherently stiff, any extra stiffening effect of such excess cement within the rib channel has little effect on the elastic constant of the device.

BRIEF DESCRIPTION OF THE DRAWING

A full understanding of the invention and of its further objects and advantages will be had from the following description of certain preferred methods and apparatus for carrying it out. That description and the accompanying drawings which form a part of it are intended only as illustration and not as a limitation upon the scope of the invention.

In the drawings.

Figure 1:
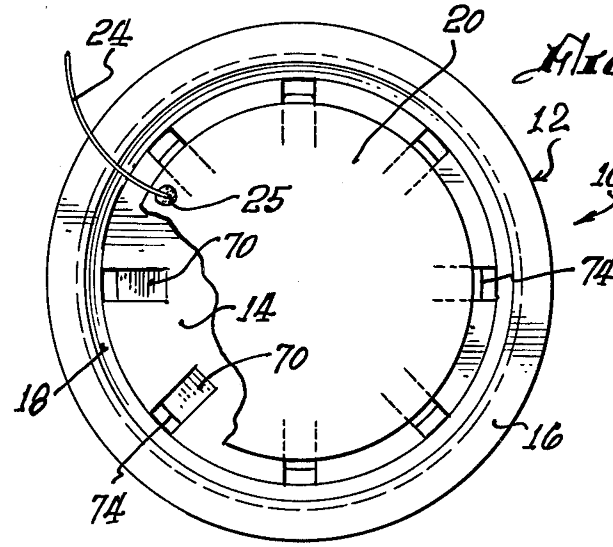
FIG. 1 is a plan, typically at enlarged scale, representing a diaphragm and sensor embodying the invention.
Figure 2:
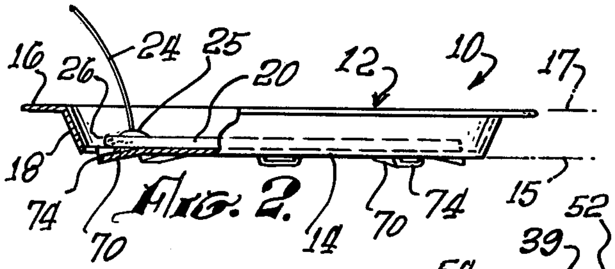
FIG. 2 is an elevation corresponding to FIG. 1, partly broken away to an axial plane.

The illustrative diaphragm assembly shown at 10 in FIGS. 1 and 2 comprises the circular metal diaphragm member 12 and the piezoelectric sensing element 20, which are coaxially assembled on the axis of symmetry 11. Diaphragm member 12 includes the central diaphragm portion 14 and the outer, annular mounting portion 16. Those diaphragm portions are axially offset in respective parallel planes, indicated schematically at 15 and 17, respectively, and are joined by the generally cylindrical coupling structure 18. That structure is preferably an integral part of the diaphragm member, which may be made by conventional forming or drawing of a single circular piece of sheet metal. Cylindrical section 18 provides enhanced flexibility in a radial direction, stabilizing the resonant frequency against thermal and other effects due to clamping of the diaphragm rim portion 16. See the above identified copending application.

Sensing element 20 typically comprises a disk of piezoelectric ceramic material that has been treated in known manner to produce a voltage difference between its two faces when bent out of its plane. The faces of the ceramic disk are made conductive, as by deposition of suitable electrode material. One disk face is adhered coaxially to a face of diaphragm portion 14 of the diaphragm member, as by a thin layer of epoxy cement 23 which permits electrical contact between the two faces. The wire conductor 24 is typically soldered at 25 to the other disk face near its periphery. The electrical signal from sensor 20 may then be taken as a potential difference between conductor 24 as live terminal and diaphragm member 20 as ground terminal.

Central diaphragm portion 14 of member 12 and sensing disk 20 form a diaphragm assembly 22 which acts as an effectively integral vibrating element. The fundamental vibrating mode of that assembly comprises bending of the central area alternately upward and downward with resonant frequency corresponding to the combined masses, dimensions and elastic constants of the components, as modified by presence of coupling structure 18.

When it is desired to have the transducer sensitive to a particular frequency, the dimensions of the diaphragm assembly are chosen so that its fundamental resonance occurs close to that frequency, and the diaphragm assembly is mounted and housed in such a way that it is free to resonate without external interference. Presence of the selected frequency, as a vibration in the surrounding atmosphere or externally impressed upon the housing as a whole, for example, then causes the diaphragm and sensor to vibrate at an amplitude that is increased by resonance. The transducer thus becomes a highly sensitive instrument for detecting presence of vibrations of the selected frequency, or for producing such vibrations.

The dimensions and detailed form of the diaphragm member and sensor may vary within wide limits, being selected typically with primary reference to the desired value of the resonant frequency. The invention has been found highly effective, for example, in connection with a transducer in which the diaphragm member is of the order of one inch in overall diameter, and is formed of sheet material about 0.005 inch thick. The piezoelectric disk sensor for use with such a diaphragm is typically of the order of 0.010 inch thick with a diameter of 0.60 to 0.75 inch, yielding a resonant frequency in the neighborhood of 6 kHz.

The present invention relates more particularly to the variability of the resonant frequency as between individual transducers of a single design. The relatively large manufacturing tolerance on the sensor radius, indicated at 28 with some exaggeration for clarity of illustration, has been found capable of producing a surprisingly large uncertainty in resonant frequency, as described above.

The invention overcomes that difficulty with relatively little increase in manufacturing cost by providing means for stiffening the diaphragm member within a relatively precise annular zone which extends at least between the maximum and minimum diameters of sensor 20. That is, the stiffened zone includes at least the entire sensor tolerance zone 28.

In the present illustrative embodiment of the invention that stiffening means comprises the radial ribs 70, which project from the diaphragm face opposite to sensor 20 and extend across the annular region 72. That region includes the entire area 28 that may or may not be covered by the ceramic disk. Ribs 70 are typically formed integrally in the diaphragm member by conventional stamping means.

The ribs are preferably sheared at their outer ends 74, accurately defining the outer perimeter of the area that is stiffened. That outer perimeter preferably coincides with, or exceeds only slightly, the maximum sensor area, thereby leaving as much as possible of the bare diaphragm unaffected. The inner ends of the ribs may be treated in similar manner if desired. However, it is generally preferred that the ribs taper smoothly into the flat sheet at their inner ends, as indicated at 76. Such tapering of the stiffening action to zero at the inner boundary of zone 72 provides a smooth transition to the untreated inner area, and is believed to reduce any tendency of the ribs to disturb the normal mode of vibratory movement. However, that taper is preferably made sufficiently rapid to leave a relatively large central area of the sandwich free to bend in its normal manner.

As typically shown, ribs 70 are of angular U-section, with a constant width and with a depth which tapers uniformly from a maximum value at outer ends 74 to zero at inner ends 76. That linear shape somewhat facilitates production of the ribs by conventional forming operations, and causes only negligible variation of the rib stiffness across the relatively narrow range 28 of tolerance of the sensor perimeter.

The increased depth at the outer rib ends is also useful for providing increased volume for accommodating any excess of the cement used for securing the sensor to the diaphragm face, indicated somewhat schematically at 23. Variations in the amount of cement absorbed in that way can alter the rib stiffness; but since that stiffness is already large, the relative effect is small. Any resulting variability of the resonant frequency is correspondingly small, and is found to be negligible in practice, especially when compared to the much larger relative effect that the same excess cement would have if extruded onto the bare diaphragm surface.

The basic effect of the described ribs 70 is to impart to the diaphragm member an enhanced stiffness with respect to the normal mode of vibration, extending throughout the region of variability of the sensor area. The overall effective elastic behavior of the diaphragm assembly is thereby made virtually independent of the precise location of the sensor perimeter. Normal variability of the sensor diameter and small deviations from precise concentricity in its placement on the diaphragm then cause only relatively slight changes in resonant frequency from one unit to another. Hence normal variability of the sensor diameter, which can cause excessive variations from one unit to another in the resonant frequency, are masked by the rib stiffness and produce only negligible effects.

Figure 3:
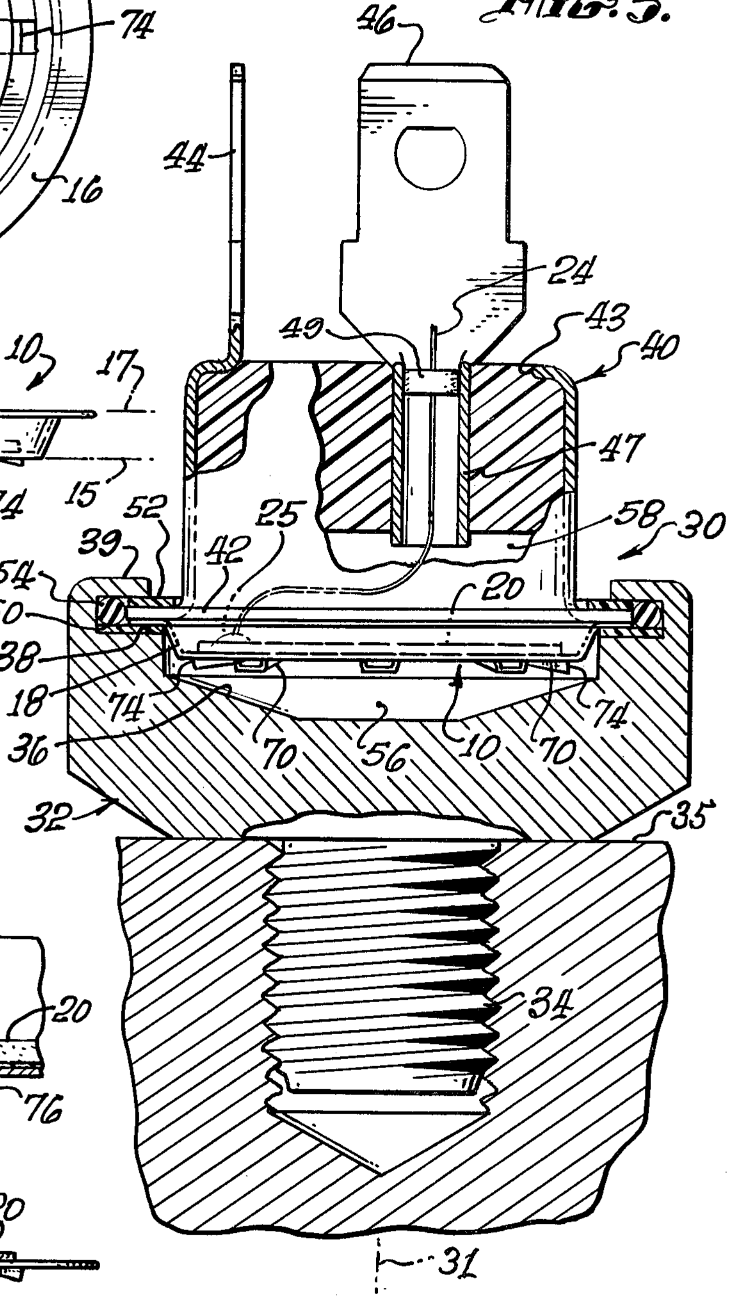
FIG. 3 is an axial section representing illustrative mounting and housing structure for the invention.
Figure 4:
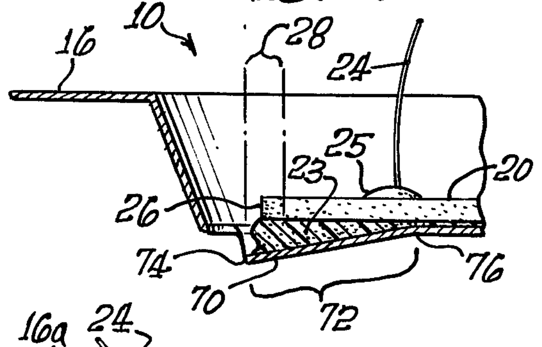
FIG. 4 is a section corresponding to a portion of FIG. 2 at further enlarged scale.

Illustrative mounting and housing structure for sensing mechanical vibrations in a machine frame or other test member is represented at 30 in FIG. 3, with its axis of symmetry 31 shown vertical for illustration. The housing base 32 carries at its lower end suitable mounting structure, shown as the threaded coaxial boss 34, for rigidly mounting the instrument on the test member 35 which is to be monitored for appearance of the resonant frequency. The upper end of base 32 is coaxially hollowed to form the recess 36, surrounded by the upwardly facing annular mounting surface 38 and the relatively thin outer retaining flange 39, which can be rolled from an initial axial position to the clamping position shown.

The cover member 40 is of general cup shape with the flaring mounting rim 42. A generally circular opening 43 is cut in the flat cup base, and the trimmed flap is bent up to form a conventional electrical spade terminal, seen edge-on at 44. A second terminal 46 with a blade of similar shape and with an integral tubular conductor guide 47 is mounted in insulated relation in cover opening 43, as by the sealing wall 48 of potting compound, defining the chamber 58. Conductor guide 47 forms a clear passage through that wall for insertion of conductor 24.

Rim portion 16 of the diaphragm member is preferably spaced from mounting surface 38 by the spacing and centering ring 50 of electrically insulating material such as glass reinforced epoxy, for example. Conductor 24 is soldered to terminal 46 at 49, sealing the passage in guide 47. Base flange 39 is rolled down over the O-ring 54 and the second spacing and insulating ring 52, firmly clamping the assembly together and sealing the housing hermetically against external contamination.

The housing structure of FIG. 3 is merely illustrative, and can be varied as desired to meet special requirements, so long as the diaphragm assembly 22 remains free to vibrate without interference at its resonant frequency. For example, it may be desired to sense or to produce vibrations of a particular frequency in a gaseous medium such as air, rather than in a mechanical body such as test member 35. For that purpose, base 32 may be provided in known manner with mounting structure of any suitable type at its periphery to replace mounting stud 34, and the lower part of the base may be provided in known manner with adequate openings between the chamber 56 and the exterior for passage of atmospheric vibrations.

Ribs 74 or equivalent structure for locally stiffening the diaphragm in accordance with the present invention are preferably used in combination with the cylindrical structure indicated at 18 and more fully described and claimed in the above identified copending application. However, the advantages offered by the present invention are also useful independently of other frequency stabilizing means.

Figure 5:
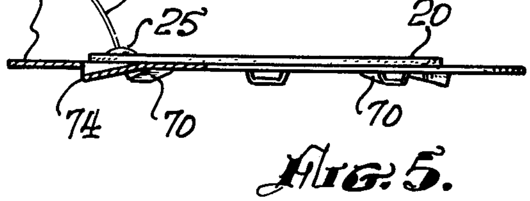
FIG. 5 is an elevation corresponding generally to FIG. 2 and representing a modification.

FIG. 5 represents an illustrative embodiment of the invention in a conventional flat diaphragm member with edge portion 16a in the same plane as diaphragm portion 14. Local stiffening of such a diaphragm is typically obtained by a plurality of angularly spaced ribs 70 basically similar to those previously described and functioning in essentially the same manner.

Thus, the invention provides a significant improvement in the art of piezoelectric ceramic transducers of resonant type by virtually eliminating the usual relatively free tolerance on the diameter of the ceramic sensing disk as a cause of variability of the resonant frequency from one unit to another.

We claim:

1. Piezoelectric transducer including a diaphragm member having a central circular diaphragm portion carrying a concentrically mounted piezoelectric ceramic sensor, and having a peripheral portion adapted to be rigidly mounted on housing structure with the diaphragm portion and sensor free to vibrate in normal mode at a resonant frequency; characterized in that the sensor diameter is variable from unit to unit within a predetermined range of diameters, and said transducer includes means for locally stiffening the diaphragm member with respect to said normal mode of vibration at a limited annular zone which includes and is predominantly limited to the annular zone between the maximum and minimum diameters corresponding to said range of variability of said sensor, the normal mode resonant frequency of the so stiffened diaphragm portion and sensor being substantially independent of said variations of sensor diameter.

2. Transducer according to claim 1 wherein said stiffening means has maximum stiffness adjacent the radially outer boundary of said zone and said stiffness decreases smoothly to a minimum at the inner boundary of said zone.

3. Transducer according to claim 1 wherein said stiffening means comprises a plurality of radially extending, angularly spaced corrugations formed into said diaphragm portion on the side of the diaphragm member opposite to said sensor.

4. Transducer according to claim 3 wherein the transverse dimension of said ribs decreases radially inwardly and fades smoothly into the flat surface of the diaphragm.

5. Transducer according to claim 3 wherein said ribs terminate abruptly at their outer ends substantially at the maximum radius of said sensor.

6. Transducer according to claim 1 wherein said diaphragm portion and said mounting portion of the diaphragm member are located in respective axially spaced parallel planes and are interconnected by an integrally formed, generally cylindrical coupling portion.

7. Transducer according to claim 6 wherein said stiffening means comprises radial corrugations formed on the side of said diaphragm portion opposite to said sensor and opposite to said coupling portion.

8. Transducer according to claim 7 wherein said corrugations are sheared at their outer ends in substantial alignment with the maximum radius of said sensor.

9. In the manufacture of a piezoelectric transducer which comprises a circular metal diaphragm member having a peripheral mounting portion and a central vibratory portion which carries a concentrically mounted piezoelectric sensor, the method of making the resonant frequency of the transducer substantially independent of a predetermined range of variability in the diameter of the sensor; said method comprising forming into the diaphragm member a plurality of corrugations which extend radially at uniform angular intervals on one face of the diaphragm member, the radial extent of said corrugations including and being predominantly limited to the annular zone of the diaphragm member between the maximum and minimum diameters corresponding to said range of variability of the sensor diameter, and mounting the sensor concentrically on the other face of the diaphragm member.

* * * * *